United States Patent [19]
Liebert et al.

[11] Patent Number: 6,020,592
[45] Date of Patent: Feb. 1, 2000

[54] DOSE MONITOR FOR PLASMA DOPING SYSTEM

[75] Inventors: Reuel B. Liebert, Peabody; Bjorn O. Pedersen, Chelmsford, both of Mass.; Matthew Goeckner, Palo Alto, Calif.

[73] Assignee: Varian Semiconductor Equipment Associates, Inc., Gloucester, Mass.

[21] Appl. No.: 09/128,370

[22] Filed: Aug. 3, 1998

[51] Int. Cl.⁷ .................................................. H01J 37/244
[52] U.S. Cl. ....................................................... 250/492.21
[58] Field of Search ............................ 250/492.21, 492.2

[56] References Cited

U.S. PATENT DOCUMENTS

| | | |
|---|---|---|
| 4,135,097 | 1/1979 | Forneris et al. . |
| 4,228,358 | 10/1980 | Ryding . |
| 4,234,797 | 11/1980 | Ryding . |
| 4,361,762 | 11/1982 | Douglas . |
| 4,421,988 | 12/1983 | Robertson et al. . |
| 4,433,247 | 2/1984 | Turner . |
| 4,463,255 | 7/1984 | Robertson et al. . |
| 4,587,433 | 5/1986 | Farley . |
| 4,595,837 | 6/1986 | Wu et al. . |
| 4,751,393 | 6/1988 | Corey, Jr. et al. . |
| 4,786,814 | 11/1988 | Kolondra et al. . |
| 5,354,381 | 10/1994 | Sheng . |
| 5,825,035 | 10/1998 | Mizumura et al. ................. 250/492.21 |

OTHER PUBLICATIONS

Article by Erin C. Jones and Nathan W. Cheung, entitled "Plasma Doping Dosimetry," published in *IEEE Transactions on Plasma Science* in Feb. 1997, in vol. 25, No. 1, pp. 42–52.

*Primary Examiner*—Kiet T. Nguyen
*Attorney, Agent, or Firm*—Wolf, Greenfield & Sacks, P.C.

[57] ABSTRACT

Plasma doping apparatus includes a plasma doping chamber, a platen mounted in the plasma doping chamber for supporting a workpiece such as a semiconductor wafer, a source of ionizable gas coupled to the chamber, an anode spaced from the platen and a pulse source for applying high voltage pulses between the platen and the anode. The high voltage pulses produce a plasma having a plasma sheath in the vicinity of the workpiece. The high voltage pulses accelerate positive ions across the plasma sheath toward the platen for implantation into the workpiece. The plasma doping apparatus includes at least one Faraday cup positioned adjacent to the platen for collecting a sample of the positive ions accelerated across the plasma sheath. The sample is representative of the dose of positive ions implanted into the workpiece.

40 Claims, 4 Drawing Sheets

DOSE MONITOR FOR PLASMA DOPING SYSTEM

FIELD OF THE INVENTION

This invention relates to plasma doping systems used for ion implantation of workpieces and, more particularly, to methods and apparatus for measuring the ion dose implanted into the workpiece in plasma doping systems.

BACKGROUND OF THE INVENTION

Ion implantation is a standard technique for introducing conductivity-altering impurities into semiconductor wafers. In a conventional ion implantation system, a desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

In some applications, it is necessary to form shallow junctions in a semiconductor wafer, where the impurity material is confined to a region near the surface of the wafer. In these applications, the high energy acceleration and the related beam forming hardware of conventional ion implanters are unnecessary. Accordingly, it has been proposed to use plasma doping systems for forming shallow junctions in semiconductor wafers. In a plasma doping system, a semiconductor wafer is placed on a conductive platen which functions as a cathode. An ionizable gas containing the desired dopant material is introduced into the chamber, and a high voltage pulse is applied between the platen and an anode or the chamber walls, causing formation of a plasma having a plasma sheath in the vicinity of the wafer. The applied voltage causes ions in the plasma to cross the plasma sheath and to be implanted into the wafer. The depth of implantation is related to the voltage applied between the wafer and the anode. A plasma doping system is described in U.S. Pat. No. 5,354,381 issued Oct. 11, 1994 to Sheng.

In the plasma doping system described above, the high voltage pulse generates a plasma and accelerates positive ions from the plasma toward the wafer. In other types of plasma systems, known as plasma immersion systems, a continuous RF voltage is applied between the platen and the anode, thus producing a continuous plasma. At intervals, a high voltage pulse is applied between the platen and the anode, causing positive ions in the plasma to be accelerated toward the wafer.

Exacting requirements are placed on semiconductor fabrication processes involving ion implantation with respect to the cumulative ion dose implanted into the wafer and dose uniformity across the wafer surface. The implanted dose determines the electrical activity of the implanted region, while dose uniformity is required to ensure that all devices on the semiconductor wafer have operating characteristics within specified limits.

One prior art approach to dose measurement in plasma doping systems involves measurement of the current delivered to the plasma by the high voltage pulses, as described in the aforementioned U.S. Pat. No. 5,354,381. However, this approach is subject to inaccuracies. The measured current includes electrons generated during ion implantation and excludes neutral molecules that are implanted into the workpiece, even though these neutral molecules contribute to the total dose. Furthermore, since the measured current passes through the wafer being implanted, it is dependent on the characteristics of the wafer, which may produce errors in the measured current. Those characteristics include emissivity, local charging, gas emission from photoresist on the wafer, etc. Thus, different wafers give different measured currents for the same ion dose. In addition, the measured current pulses include large capacitive or displacement current components which may introduce errors in the measurement.

A technique for plasma doping dosimetry is described by E. Jones et al. in *IEEE Transactions on Plasma Science*, Vol. 25, No. 1, February 1997, pp. 42–52. Measurements of implanter current and implant voltage are used to determine an implant profile for a single implant pulse. The implant profile for a single pulse is used to project the final implant profile and total implanted dose. This approach is also subject to inaccuracies, due in part to the fact that it depends on power supply and gas control stability to ensure repeatability. Furthermore, the empirical approach is time consuming and expensive.

In conventional ion implantation systems which involve the application of a high energy beam to the wafer, cumulative ion dose is typically measured by a Faraday cup, or Faraday cage, positioned in front of the target wafer. The Faraday cage is typically a conductive enclosure, often with the wafer positioned at the downstream end of the enclosure and constituting part of the Faraday system. The ion beam passes through the Faraday cage to the wafer and produces an electrical current in the Faraday. The Faraday current is supplied to an electronic dose processor, which integrates the current with respect to time to determine the total ion dosage. The dose processor may be part of a feedback loop that is used to control the ion implanter.

Various Faraday cage configurations for ion implanters have been disclosed in the prior art. Faraday cages positioned in front of semiconductor wafers are disclosed in U.S. Pat. No. 4,135,097 issued Jan. 16, 1979 to Forneris et al; U.S. Pat. No. 4,433,247 issued Feb. 21, 1984 to Turner; U.S. Pat. No. 4,421,988 issued Dec. 20, 1983 to Robertson et al; U.S. Pat. No. 4,463,255 issued Jul. 31, 1984 to Robertson et al; U.S. Pat. No. 4,361,762 issued Nov. 30, 1982 to Douglas; U.S. Pat. No. 4,786,814 issued Nov. 22, 1988 to Kolondra et al; and U.S. Pat. No. 4,595,837 issued Jun. 17, 1986 to Wu et al. Faraday cages positioned behind a rotating disk are disclosed in U.S. Pat. No. 4,228,358 issued Oct. 14, 1980 to Ryding; U.S. Pat. No. 4,234,797 issued Nov. 18, 1980 to Ryding; and U.S. Pat. No. 4,587,433 issued May 6, 1986 to Farley.

Dose and dose uniformity have also been measured in conventional high energy ion implantation systems using a corner cup arrangement as disclosed in U.S. Pat. No. 4,751,393 issued Jun. 14, 1988 to Corey, Jr. et al. A mask having a central opening is positioned in the path of the ion beam. The beam is scanned over the area of the mask with the portion passing through the central opening impinging on the wafer. Small Faraday cups are located at the four corners of the mask and sense the beam current at these locations.

SUMMARY OF THE INVENTION

According a first aspect of the invention, plasma doping apparatus is provided. The plasma doping apparatus comprises a plasma doping chamber, a platen mounted in the plasma doping chamber for supporting a workpiece, typically a semiconductor wafer, which is the cathode of the system, a source of ionizable gas coupled to the chamber, an anode spaced from the platen and a pulse source for applying high voltage pulses between the cathode and the anode. The high voltage pulses produce a plasma having a plasma sheath in the vicinity of the workpiece. The plasma contains positive ions of the ionizable gas. The high voltage pulses accelerate the positive ions across the plasma sheath toward the platen for implantation into the workpiece. The plasma doping apparatus further comprises one or more Faraday cups positioned adjacent to the platen for collecting a sample of the positive ions accelerated across the plasma sheath. The sample is representative of the dose of positive ions implanted into the workpiece. An optional guard ring can be used to modify the plasma shape to obtain the desired uniform plasma density facing the workpiece.

The apparatus may include a single Faraday cup or two or more Faraday cups disposed around the platen. An annular Faraday cup may be disposed around the platen. When the plasma doping apparatus includes a guard ring, the Faraday cup is preferably embedded within the guard ring. The guard ring can be maintained at either the cathode potential or at another potential which is selected to control the plasma uniformity. By maintaining the Faraday cups embedded in the guard ring at the same potential as the guard ring, the unwanted capacitive component of the measured current pulses is minimized or eliminated.

A variety of different Faraday cup configurations may be utilized. In one embodiment, the entrance to the Faraday cup is substantially coplanar with the workpiece, and the Faraday cup is maintained at substantially the same electrical potential as the platen. In another embodiment, an electrically conductive mask is positioned in front of the Faraday cup. The mask has an opening aligned with the entrance to the Faraday cup. The mask and the platen are maintained at substantially equal electrical potentials. In a further embodiment, the apparatus includes an electrode positioned at the entrance to the Faraday cup and a voltage source for biasing the electrode to suppress escape of secondary electrons from the Faraday cup. Such a bias may also have the beneficial effect of suppressing hollow cathode discharge formation. In yet another embodiment, a magnet may be positioned at the entrance to the Faraday cup for suppressing escape of secondary electrons. In still another embodiment, the Faraday cup has an entrance with a lateral dimension that is small in comparison with the depth of the Faraday cup, so that the geometric configuration of the Faraday cup suppresses escape of secondary electrons.

The Faraday cup generates a current representative of the ion current implanted into the workpiece. The apparatus may further comprise a dose processing circuit for integrating the current with respect to time and producing an output representative of the dose of positive ions implanted into the workpiece.

In the embodiment including two or more Faraday cups disposed around the platen, each Faraday cup produces a current representative of the ion current implanted into the workpiece. The plasma doping apparatus may further comprise a dose uniformity circuit for comparing the currents produced by the Faraday cups and generating an output indicative of the uniformity of ion implantation into the workpiece.

In one embodiment, a separate anode is provided within the plasma doping chamber. The plasma doping chamber may have electrically-conductive walls. The anode and the chamber walls may be connected to a common electrical potential, such as ground. In another embodiment, a separate anode is not utilized, and the electrically-conductive chamber walls function as the anode.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
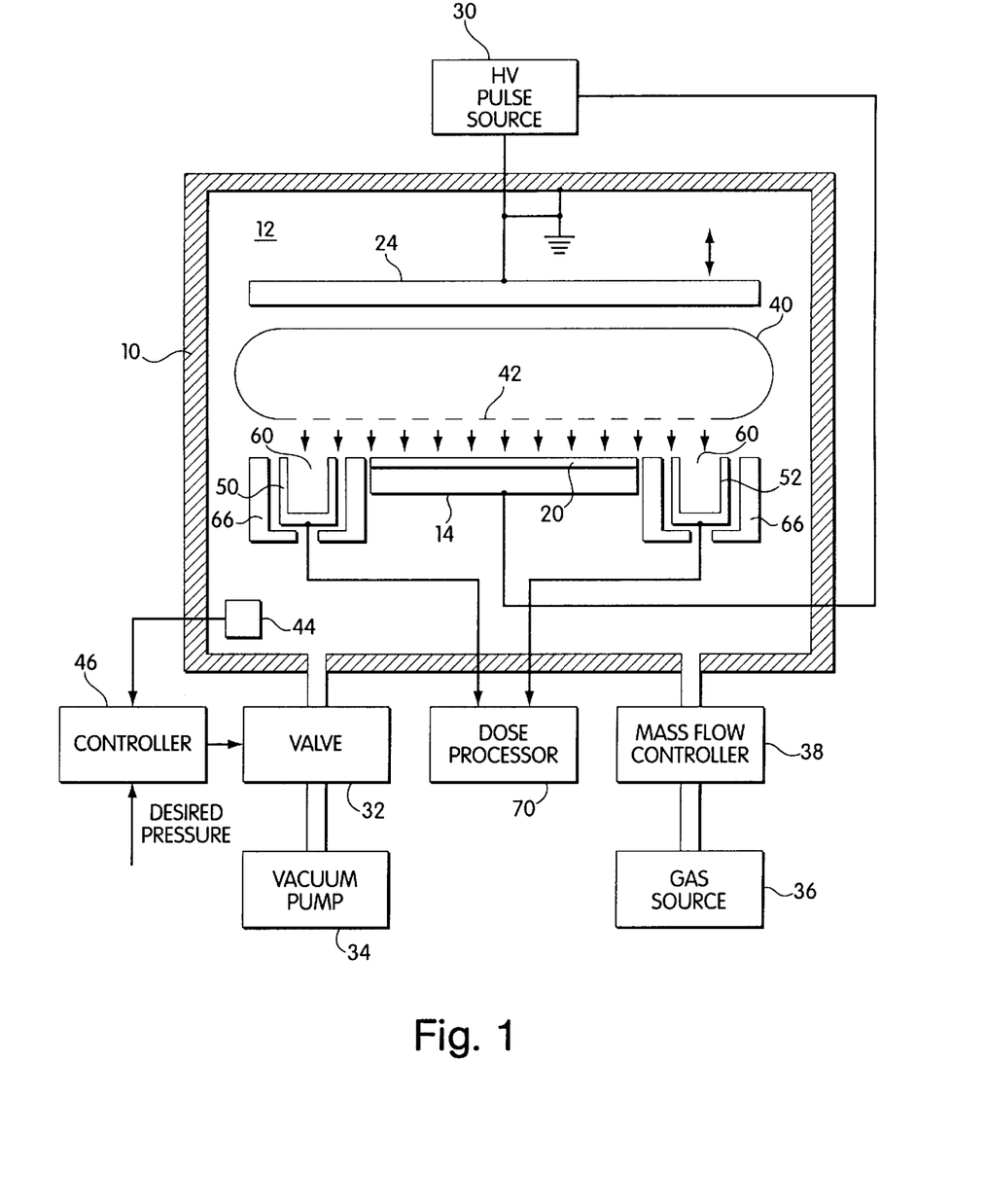
FIG. 1 is a simplified schematic block diagram of a plasma doping system in accordance with a first embodiment of the present invention.

An example of plasma doping system in accordance with the present invention is shown schematically in FIG. 1. A plasma doping chamber 10 defines an enclosed volume 12. A platen 14 positioned within chamber 10 provides a surface for holding a workpiece, such as a semiconductor wafer 20. The wafer 20 may, for example, be clamped at its periphery to a flat surface of platen 14. The platen 14 supports wafer 20 and provides an electrical connection to wafer 20. In one embodiment, the platen has an electrically-conductive surface for supporting wafer 20. In another embodiment, the platen includes conductive pins for electrical connection to wafer 20.

An anode 24 is positioned within chamber 10 in spaced relation to platen 14. Anode 24 may be movable in a direction, indicated by arrow 26, perpendicular to platen 14. The anode 24 is typically connected to electrically-conductive walls of chamber 10, both of which may be connected to ground.

The wafer 20 and the anode 24 are connected to a high voltage pulse generator 30, so that wafer 20 functions as a cathode. The pulse generator 30 typically provides pulses in a range of about 100 to 3000 volts, about 1 to 50 microseconds in duration and a pulse repetition rate of about 100 Hz to 2 KHz. It will be understood that these pulse parameter values are given by way of example only and that other values may be utilized within the scope of the invention.

The enclosed volume 12 of chamber 10 is coupled through a controllable valve 32 to a vacuum pump 34. A gas source 36 is coupled through a mass flow controller 38 to chamber 10. A pressure sensor 44 located within chamber 10 provides a signal indicative of chamber pressure to a controller 46. The controller 46 compares the sensed chamber pressure with a desired pressure input and provides a control signal to valve 32. The control signal controls valve 32 so as to minimize the difference between the chamber pressure and the desired pressure. Vacuum pump 34, valve 32, pressure sensor 44 and controller 46 constitute a closed loop pressure control system. The pressure is typically controlled in a range of about one millitorr to about 500 millitorr, but is not limited to this range. Gas source 36 supplies an ionizable gas containing a desired dopant for implantation into the workpiece. Examples of ionizable gas include $BF_3$, $N_2$, Ar, $PF_5$ and $B_2H_6$. Mass flow controller 38 regulates the rate at which gas is supplied to chamber 10. The configuration shown in FIG. 1 provides a continuous flow of process gas at a constant gas flow rate and constant pressure. The pressure and gas flow rate are preferably regulated to provide repeatable results.

In operation, wafer 20 is positioned on platen 14. Then the pressure control system, mass flow controller 38 and gas source 36 produce the desired pressure and gas flow rate within chamber 10. By way of example, the chamber 10 may operate with $BF_3$ gas at a pressure of 10 millitorr. The pulse generator 30 applies a series of high voltage pulses to wafer 20, causing formation of a plasma 40 between wafer 20 and anode 24. As known in the art, the plasma 40 contains positive ions of the ionizable gas from gas source 36. The plasma 40 further includes a plasma sheath 42 in the vicinity of platen 14. The electric field that is present between anode 24 and platen 14 during the high voltage pulse accelerates positive ions from plasma 40 across plasma sheath 42 toward platen 14. The accelerated ions are implanted into wafer 20 to form regions of impurity material. The pulse voltage is selected to implant the positive ions to a desired depth in wafer 20. The number of pulses and the pulse duration are selected to provide a desired dose of impurity material in wafer 20. The current per pulse is a function of pulse voltage, gas pressure and species and any variable position of the electrodes. For example, the cathode to anode spacing may be adjusted for different voltages.

Figure 2:
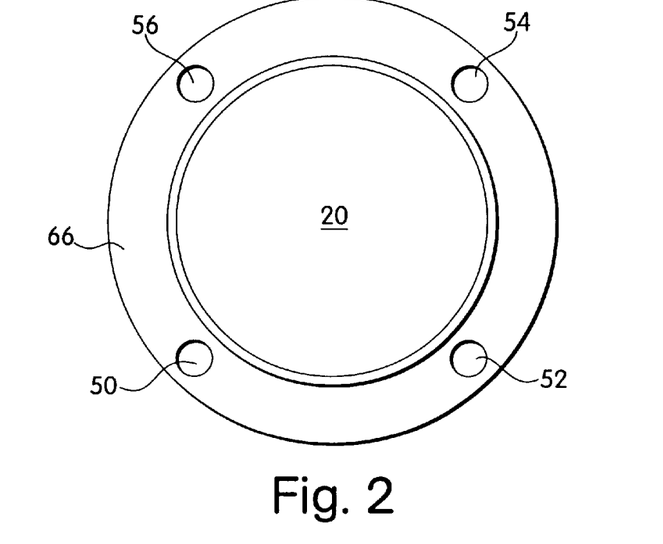
FIG. 2 is a partial schematic cross-sectional view of the plasma doping system of FIG. 1, showing the wafer and the Faraday cups.

In accordance with the present invention, one or more Faraday cups are positioned adjacent to platen 14 for measuring the ion dose implanted into wafer 20. In the example of FIGS. 1 and 2, Faraday cups 50, 52, 54 and 56 are equally spaced around the periphery of wafer 20. Each Faraday cup comprises a conductive enclosure having an entrance 60 facing plasma 40. Each Faraday cup is preferably positioned as close as is practical to wafer 20 and intercepts a sample of the positive ions accelerated from plasma 40 toward platen 14.

The Faraday cups are electrically connected to a dose processor 70 or other dose monitoring circuit. As known in the art, positive ions entering each Faraday cup through entrance 60 produce a current in the electrical circuit connected to the Faraday cup. The electrical current is indicative of the number of positive ions received per unit time, or ion current. It is assumed that the ion currents received by Faraday cups 50, 52, 54 and 56 have a fixed relation to the number of ions implanted in wafer 20 per unit time. Depending on the uniformity of plasma 40 and the uniformity of ion acceleration toward platen 14, the ion current per unit area received by each Faraday cup may be substantially equal to or a fixed fraction of the ion current per unit area implanted in wafer 20. Since the electrical current output of each of the Faraday cups is representative of the ion current implanted in wafer 20, the Faraday cups 50, 52, 54 and 56 provide a measurement of the ion dose implanted in wafer 20.

As described in U.S. Pat. No. 5,711,812 issued Jan. 27, 1998 to Chapek et al, the plasma doping system may include a guard ring 66 that surrounds platen 14. The guard ring 66 is biased to insure a relatively uniform distribution of implanted ions near the edge of wafer 20. The Faraday cups 50, 52, 54 and 56 may be positioned within guard ring 66 near the periphery of wafer 20 and platen 14.

Figure 3:
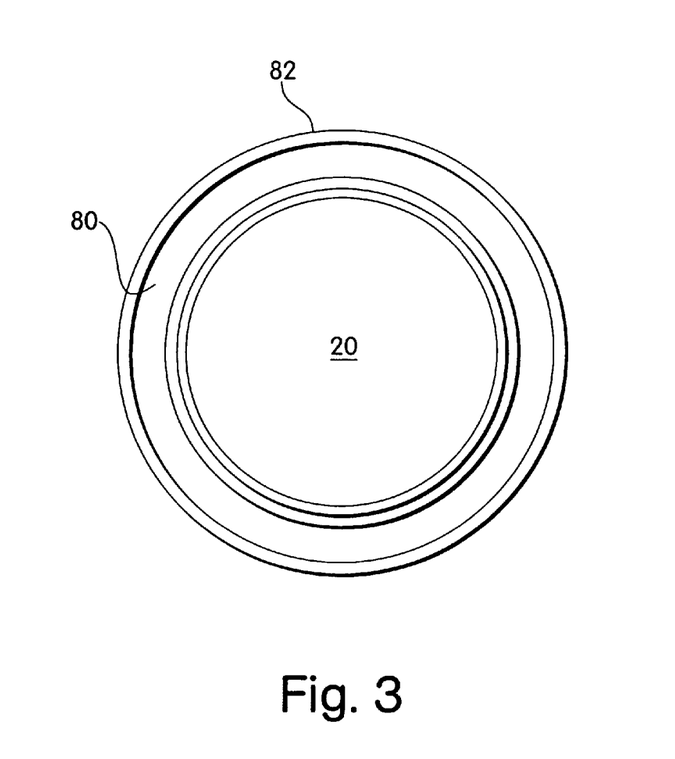
FIG. 3 is a partial schematic cross-sectional view of the plasma doping system in accordance with a second embodiment of the invention.

It will be understood that a variety of different Faraday cup configurations may be utilized within the scope of the present invention. A second embodiment is shown in FIG. 3. An annular Faraday cup 80 is positioned around wafer 20 and platen 14. The annular Faraday cup 80 has the advantage that localized variations in ion current are averaged around the periphery of wafer 20. Faraday cup 80 may be positioned in an annular guard ring 82. In general, any configuration of one or more Faraday cups may be utilized. The Faraday cups are preferably located as close as is practical to wafer 20 and platen 14. However, the Faraday cups may have any positions relative to wafer 20 that provide a measurement representative of ion current implanted into wafer 20.

As indicated above, an electrical signal representative of ion current is supplied from the Faraday cup or cups to dose processor 70. In one embodiment, the electrical current from each Faraday cup is supplied directly to dose processor 70 located external to chamber 10. In another embodiment, a preprocessing circuit (not shown) may be located in close proximity to platen 14 and may operate at the voltage of platen 14. The circuit preprocesses the outputs of the Faraday cups and supplies a result to dose processor 70.

The total ion dose delivered to wafer 20 is the instantaneous ion current integrated over the time of the implant. The dose processor 70 typically includes a circuit for integrating the outputs of the Faraday cups. The integrator may utilize conventional integrator circuits, charge sensitive amplifiers, or any other suitable circuit for performing the integration function. Where the system includes two or more Faraday cups, the outputs may be averaged to determine total dose. Dose processor configurations are known in connection with conventional high energy ion implanters.

According to a further aspect of the invention, two or more Faraday cups may be utilized to obtain a measure of dose uniformity. Dose uniformity is the uniformity of implanted ions over the surface area of wafer 20. With reference to FIG. 2, when the implanted ion dose in wafer 20 is uniform, Faraday cups 50, 52, 54 and 56 receive equal ion currents. When the dose is not uniform, the Faraday cups receive different ion currents. Accordingly, the current outputs of the Faraday cups may be compared with each other or with a reference to obtain a measure of uniformity. Thus, for example, if one or more of the Faraday cups provide an ion current that is different from the others, non-uniform ion implantation is indicated. The indication of non-uniform implantation may, for example, be used to control the process, such as by stopping or altering the ion implantation.

The Faraday cup or cups used in the plasma doping system may have a variety of different configurations. In a basic configuration illustrated in FIG. 1, entrance 60 of each Faraday cup may be coplanar with the surface of wafer 20 facing plasma 40. Each Faraday cup may be at the same electrical potential as platen 14 so as to minimize any disturbance to plasma 40 by the Faraday cups.

Figure 4:
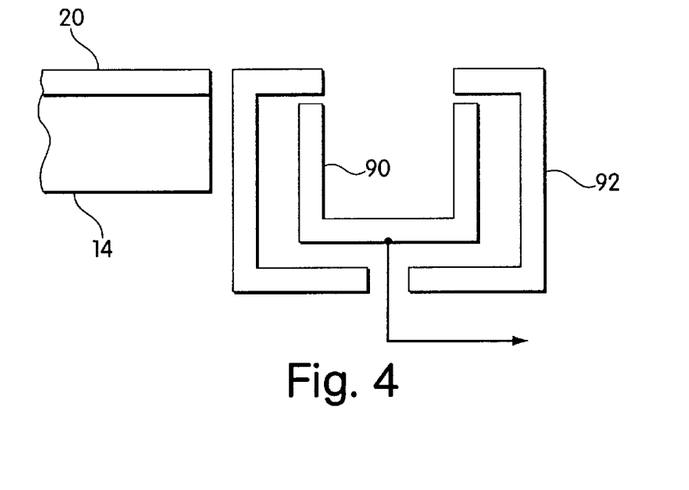
FIG. 4 is a schematic cross-sectional view of a Faraday cup configuration in accordance with a third embodiment of the invention.

Another Faraday cup configuration is shown in FIG. 4. A Faraday cup 90 is embedded in a guard ring 92. The Faraday cup 90 is preferably maintained at the same potential as the guard ring 92. This configuration suppresses the capacitive component of the measured current pulses.

Figure 5:
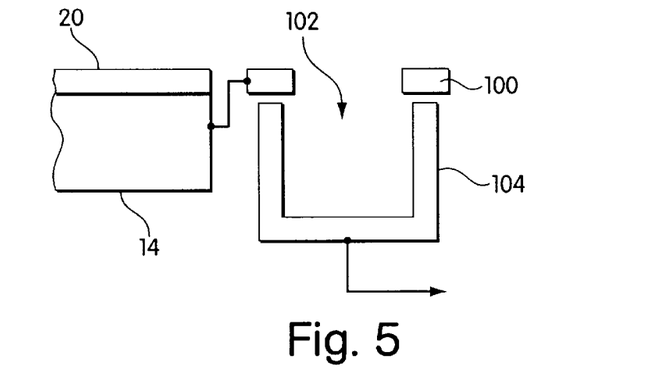
FIG. 5 is a schematic cross-sectional view of a Faraday cup configuration in accordance with a fourth embodiment of the invention.

Another Faraday cup configuration is illustrated in FIG. 5. A Faraday cup assembly includes an electrically conductive mask 100 having an opening 102 positioned in front of a Faraday cup 104. The mask 100 and the Faraday cup 104 are positioned adjacent to platen 14 and wafer 20, and the mask 100 is maintained at the electrical potential of platen 14. This configuration permits the Faraday cup 104 to be biased at a voltage different from platen 14, while mask 100 minimizes any disturbance to plasma 40 caused by the presence of Faraday cup 104. A mask of this type may be used in any configuration that uses one or more Faraday cups as described herein.

Figure 6:
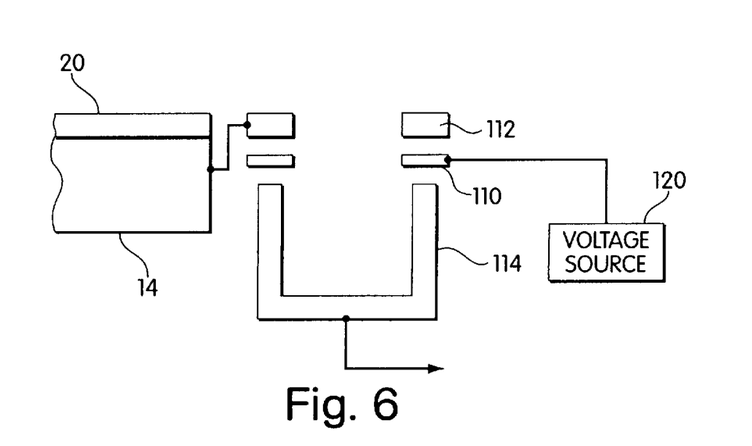
FIG. 6 is a schematic cross-sectional view of a Faraday cup configuration in accordance with a fifth embodiment of the invention.

Another Faraday cup configuration is shown in FIG. 6. A Faraday cup assembly includes an electrode 110 positioned between a mask 112 and the entrance to a Faraday cup 114. Electrode 110 and mask 112 each have an opening aligned with the entrance to Faraday cup 114. The mask 112 is preferably maintained at the electrical potential of platen 14. Electrode 110 is connected to a voltage source 120 which provides a voltage selected to suppress escape of secondary electrons from Faraday cup 114. The electrode 110 provides electrostatic suppression of secondary electrons and may have a beneficial effect in suppression of hollow cathode discharges. Electrons escaping from the Faraday cup introduce errors into the measured ion dose.

Figure 7:
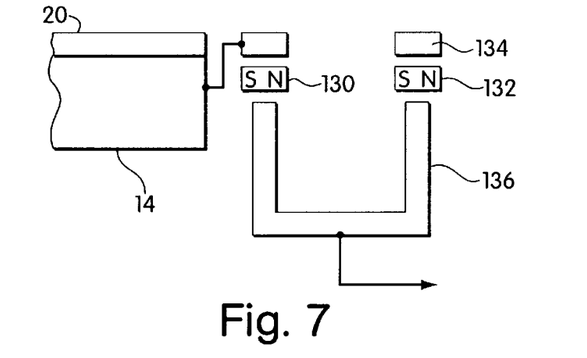
FIG. 7 is a schematic cross-sectional view of a Faraday cup configuration in accordance with a sixth embodiment of the invention.

Another Faraday cup configuration is shown in FIG. 7. A Faraday cup assembly includes magnets 130 and 132 positioned between a mask 134 and an entrance to a Faraday cup 136. The mask 134 and magnets 130, 132 define an opening aligned with the entrance to Faraday cup 136. The mask 134 may be maintained at the same electrical potential as platen 14. The magnets 130 and 132 produce magnetic fields at the entrance of Faraday cup 136 which suppress escape of secondary electrons. The magnets 130 and 132 provide magnetic suppression of secondary electrons.

Figure 8:
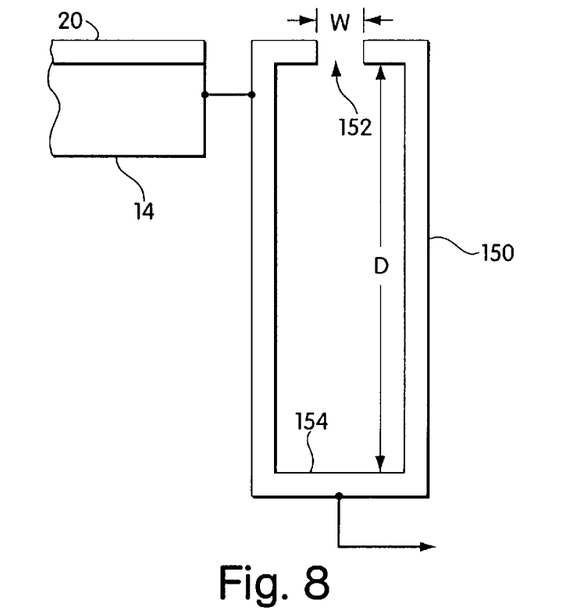
FIG. 8 is a schematic cross-sectional view of a Faraday cup configuration in accordance with a seventh embodiment of the invention.

Another Faraday cup configuration is shown in FIG. 8. A Faraday cup 150 has a geometric configuration that inhibits escape of secondary electrons. In particular, the interior depth D of Faraday cup 150 is large in comparison with the width W of Faraday cup entrance 152. In this configuration, secondary electrons generated at a bottom surface 154 of Faraday cup 150 have a relatively small probability of escaping through entrance 152.

Figure 9:
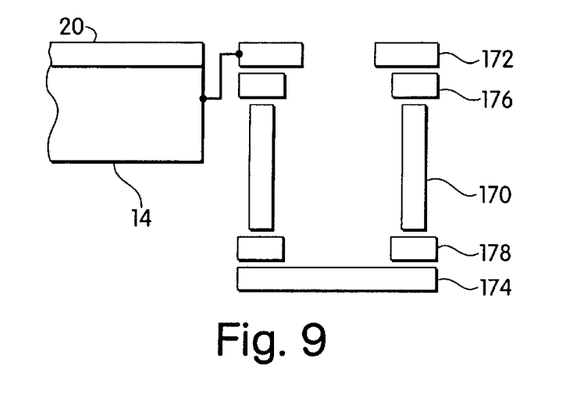
FIG. 9 is a schematic cross-sectional view of a Faraday cup configuration in accordance with an eighth embodiment of the invention.

Another Faraday cup configuration is shown in FIG. 9. A Faraday cup assembly includes a secondary electron collector ring 170 disposed between an entrance aperture plate 172 and an ion collector plate 174. The secondary electron collector ring 170 is insulated from entrance aperture plate 172 by an insulating washer 176, and is insulated from ion collector plate 174 by an insulating washer 178. The secondary electron collector ring 170 may be maintained at a potential of about 10–100 volts positive with respect to ion collector plate 174 by a voltage source (not shown) or by a voltage divider (not shown) connected between the cathode and anode potentials. By preventing secondary electrons formed at the ion collector plate 174 from moving toward the Faraday cup entrance, this configuration is effective in preventing a hollow cathode discharge from occurring. The secondary electron current flowing to the secondary electron collector ring 170 must be subtracted from the current measured by the ion collector plate 174 in order to obtain the desired net ion current, which is a measure of dose.

In each case, the Faraday cup assembly, including the Faraday cup and associated elements, if any, is preferably positioned adjacent to platen 14 and wafer 20. The top surface of the assembly is preferably coplanar or nearly coplanar with the top surface of wafer 20. The Faraday cup assembly is configured to minimize any disturbance to plasma 40 which could adversely effect both ion implantation into wafer 20 and measurement of ion current by the Faraday cup assembly.

The invention has been described thus far in connection with a plasma doping system in which a plasma is formed upon the application of a high voltage pulse between platen 14 and anode 24. One or more a Faraday cups may also be utilized in a plasma immersion system wherein a plasma is present continuously in the region between the anode and the cathode, and ions are accelerated toward the cathode by application of a high voltage pulse.

In the configuration of FIG. 1, anode 24 is separate from but electrically connected to chamber 10. In other configurations, the conductive walls of the plasma doping chamber 10 may serve as anode, and a separate anode is not utilized.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Plasma doping apparatus comprising:

a plasma doping chamber;

a platen mounted in said plasma doping chamber for supporting a workpiece, said workpiece constituting a cathode;

a source of ionizable gas coupled to said chamber, said ionizable gas containing a desired dopant for implantation into the workpiece;

an anode spaced from said platen;

a pulse source for applying high voltage pulses between said platen and said anode for producing a plasma having a plasma sheath in the vicinity of said workpiece, said plasma containing positive ions of said ionizable gas, said high voltage pulses accelerating said positive ions across the plasma sheath toward said platen for implantation into the workpiece; and a Faraday cup positioned adjacent to said platen for collecting a sample of said positive ions accelerated across said plasma sheath, said sample being representative of the number of positive ions implanted into the workpiece.

2. Plasma doping apparatus as defined in claim 1 further comprising means for maintaining said Faraday cup and said platen at substantially equal electrical potentials.

3. Plasma doping apparatus as defined in claim 1 further comprising an electrically conductive mask having an opening aligned with said Faraday cup and means for maintaining said mask and said platen at substantially equal electrical potentials.

4. Plasma doping apparatus as defined in claim 1 wherein an entrance to said Faraday cup is substantially coplanar with the workpiece.

5. Plasma doping apparatus as defined in claim 1 wherein said Faraday cup comprises a plurality of Faraday cups disposed around said platen.

6. Plasma doping apparatus as defined in claim 1 wherein said Faraday cup comprises an annular Faraday cup disposed around said platen.

7. Plasma doping apparatus as defined in claim 1 further comprising a guard ring disposed around said platen, wherein said Faraday cup is positioned within said guard ring.

8. Plasma doping apparatus as defined in claim 1 further comprising a guard ring disposed around said platen, wherein said Faraday cup comprises a plurality of Faraday cups positioned within said guard ring, and further comprising means for maintaining the Faraday cups at the same potential as the guard ring to suppress capacitive contribution to the measured current.

9. Plasma doping apparatus as defined in claim 1 further comprising a guard ring disposed around said platen, wherein said Faraday cup comprises an annular Faraday cup positioned within said guard ring, and further comprising means for maintaining the annular Faraday cup at the same potential as the guard ring to suppress capacitive contribution to the measured current.

10. Plasma doping apparatus as defined in claim 1 wherein said Faraday cup generates an electrical current representative of the number of positive ions implanted into the workpiece per unit time and wherein said apparatus further comprises a dose processing circuit for integrating said current with respect to time and generating an output representative of the dose of positive ions implanted into the workpiece.

11. Plasma doping apparatus as defined in claim 1 wherein said Faraday cup comprises a plurality of Faraday cups disposed around said platen, each producing a current representative of the number of positive ions implanted into the workpiece per unit time and wherein said plasma doping apparatus further comprises a dose uniformity circuit for comparing the currents produced by said plurality of Faraday cups and generating in response to the comparison an output indicative of the uniformity of ion implantation into the workpiece.

12. Plasma doping apparatus as defined in claim 1 further comprising an electrode positioned at an entrance of said Faraday cup and means for biasing said electrode to suppress escape of secondary electrons from said Faraday cup and/or to suppress hollow cathode discharge.

13. Plasma doping apparatus as defined in claim 1 further comprising at least one magnet disposed at an entrance of said Faraday cup for suppressing escape of secondary electrons from said Faraday cup.

14. Plasma doping apparatus as defined in claim 1 wherein said Faraday cup has an entrance having a lateral dimension, wherein the lateral dimension of said entrance is small in comparison with a depth of said Faraday cup, and wherein a geometric configuration of said Faraday cup suppresses escape of secondary electrons through said entrance.

15. Plasma doping apparatus as defined in claim 1 wherein said chamber has electrically conductive walls and wherein said anode and said chamber are connected to a common electrical potential.

16. Plasma doping apparatus as defined in claim 1 wherein said chamber includes electrically conductive walls and wherein said anode comprises the electrically conductive walls of said chamber.

17. Plasma doping apparatus as defined in claim 1 wherein said platen is configured for supporting a semiconductor wafer.

18. Plasma doping apparatus as defined in claim 1 wherein said Faraday cup comprises an entrance aperture plate defining an entrance aperture for receiving said positive ions, an ion collector plate for collecting said positive ions, a secondary electron collector ring disposed between said aperture plate and said ion collector plate, and means for biasing said secondary electron collector ring at a positive potential with respect to said ion collector plate.

19. In plasma doping apparatus comprising a plasma doping chamber, a platen mounted in said chamber for supporting a workpiece, a source of an ionizable gas coupled to said chamber, an anode spaced from said platen and a pulse source for applying high voltage pulses between said platen and said anode for producing a plasma having a plasma sheath in the vicinity of said workpiece, said plasma containing positive ions of said ionizable gas, said high voltage pulses accelerating said positive ions across the plasma sheath toward said platen for implantation into the workpiece, a method for monitoring a dose of said positive ions implanted into the workpiece comprising the step of:

collecting a sample of said positive ions accelerated across said plasma sheath with a Faraday cup positioned adjacent to said platen, said sample being representative of a number of positive ions implanted into the workpiece.

20. A method as defined in claim 19 wherein the step of collecting a sample of said positive ions is performed with a plurality of Faraday cups disposed around said platen.

21. A method as defined in claim 19 further including the step of configuring said Faraday cup so as to minimize any disturbance to said platen caused by the presence of said Faraday cup.

22. A method as defined in claim 19 further including the step of integrating an electrical current produced by said Faraday cup in response to said positive ions with respect to time and generating an output representative of the dose of positive ions implanted into the workpiece.

23. A method as defined in claim 19 wherein the step of collecting the sample of said positive ions is performed by a plurality of Faraday cups disposed around said platen, each producing a current representative of the number of positive ions implanted into the workpiece per unit time and further including the steps of comparing the currents produced by said plurality of Faraday cups and generating an output indicative of the uniformity of ion implantation into the workpiece.

24. A method as defined in claim 19 further including the step of biasing an electrode positioned at an entrance of said Faraday cup to suppress escape of secondary electrons from said Faraday cup and/or to suppress hollow cathode discharge.

25. A method as defined in claim 19 wherein the step of collecting a sample of said positive ions is performed with two or more Faraday cups embedded in a guard ring disposed around said platen.

26. A method as defined in claim 19 wherein the step of collecting a sample of said positive ions is performed with an annular Faraday cup embedded in a guard ring disposed around said platen.

27. A method as defined in claim 19 wherein the step of collecting a sample of said positive ions is performed with an ion collector plate spaced from an entrance aperture in an entrance aperture plate, further comprising the step of preventing secondary electrons formed at the ion collector plate from moving toward the entrance aperture with a secondary electron collector ring positioned between the ion collector plate and the entrance aperture.

28. Plasma doping apparatus comprising:
a plasma doping chamber;
a platen mounted in said plasma doping chamber for supporting a workpiece;
a source of ionizable gas coupled to said chamber, said ionizable gas containing a desired dopant for implantation into the workpiece;
a pulse source for applying high voltage pulses between said platen and the electrically conductive walls of said chamber for producing a plasma having a plasma sheath in the vicinity of said workpiece, said plasma containing positive ions of said ionizable gas, said high voltage pulses accelerating said positive ions across the plasma sheath toward said platen for implantation into the workpiece; and a Faraday cup positioned adjacent to said platen for collecting a sample of said positive ions accelerated across said plasma sheath, the sample of said positive ions collected by said Faraday cup being representative of a dose of said positive ions implanted into the workpiece.

29. Plasma doping apparatus as defined in claim 28 wherein said Faraday cup comprises a plurality of Faraday cups disposed around said platen.

30. Plasma doping apparatus as defined in claim 28 wherein said Faraday cup comprises an annular Faraday cup disposed around said platen.

31. Plasma doping apparatus as defined in claim 28 wherein said Faraday cup generates an electrical current representative of the number positive ions implanted into the workpiece per unit time and wherein said apparatus further comprises a dose processing circuit for integrating said current with respect to time and generating an output representative of the dose of positive ions implanted into the workpiece.

32. Plasma doping apparatus as defined in claim 28 wherein said Faraday cup comprises a plurality of Faraday cups disposed around said platen, each producing a current representative of the number of positive ions implanted into the workpiece per unit time and wherein said plasma doping apparatus further comprises a dose uniformity circuit for comparing the currents produced by said plurality of Faraday cups and generating in response to the comparison an output indicative of the uniformity of ion implantation into the workpiece.

33. Plasma doping apparatus as defined in claim 28 further comprising a guard ring disposed around said platen, wherein said Faraday cup is embedded within said guard ring.

34. Plasma doping apparatus as defined in claim 28 further comprising a closed loop pressure control system coupled to said plasma doping chamber for controlling the pressure of said ionizable gas in said chamber.

35. Plasma doping apparatus as defined in claim 28 wherein said Faraday cup comprises an entrance aperture plate defining an entrance aperture for receiving said positive ions, an ion collector plate for collecting said positive ions, a secondary electron collector ring disposed between said aperture plate and said ion collector plate, and means for biasing said secondary electron collector ring at a positive potential with respect to said ion collector plate.

36. Plasma doping apparatus comprising:

a plasma doping chamber;

a platen mounted in said plasma doping chamber for supporting a workpiece, said workpiece constituting a cathode;

an anode spaced from said platen;

a source of ionizable gas coupled to said chamber, said gas containing a desired dopant for implantation into the workpiece;

means for producing a plasma containing positive ions of said ionizable gas between said platen and said anode;

a pulse source for applying high voltage pulses between said platen and said anode for accelerating said positive ions across a plasma sheath of said plasma toward said platen for implantation into the workpiece; and a Faraday cup positioned adjacent to said platen for collecting a sample of said positive ions accelerated across said plasma sheath, said sample being representative of the dose of positive ions implanted into the workpiece.

37. Plasma doping apparatus as defined in claim 36 wherein said Faraday cup comprises a plurality of Faraday cups disposed around said platen.

38. Plasma doping apparatus as defined in claim 36 wherein said Faraday cup comprises an annular Faraday cup disposed around said platen.

39. Plasma doping apparatus as defined in claim 36 further comprising a guard ring disposed around said platen, wherein said Faraday cup is embedded within said guard ring.

40. Plasma doping apparatus as defined in claim 36 wherein said Faraday cup comprises an entrance aperture plate defining an entrance aperture for receiving said positive ions, an ion collector plate for collecting said positive ions, a secondary electron collector ring disposed between said aperture plate and said ion collector plate, and means for biasing said secondary electron collector ring at a positive potential with respect to said ion collector plate.

* * * * *